United States Patent [19]
Ishihara et al.

[11] Patent Number: 5,130,582
[45] Date of Patent: Jul. 14, 1992

[54] DELAY CIRCUIT WHICH IS FREE FROM TEMPERATURE VARIATION, POWER SUPPLY VOLTAGE VARIATION AND PROCESS VARIATION

[75] Inventors: Tsutomu Ishihara; Yasushi Tomioka; Koyu Yamanoi, all of Kanagawa, Japan

[73] Assignee: TDK Corporation, Tokyo, Japan

[21] Appl. No.: 582,747

[22] Filed: Sep. 13, 1990

[30] Foreign Application Priority Data

| Sep. 19, 1989 | [JP] | Japan | 1-242500 |
| Sep. 19, 1989 | [JP] | Japan | 1-242501 |
| Sep. 25, 1989 | [JP] | Japan | 1-248492 |
| Oct. 13, 1989 | [JP] | Japan | 1-267093 |
| Apr. 12, 1990 | [JP] | Japan | 2-96950 |

[51] Int. Cl.$^5$ .............. H03K 5/13; H03K 5/00; H03K 4/08; G05F 3/16
[52] U.S. Cl. .................. 307/591; 307/597; 307/603; 307/605; 307/608; 307/228; 307/262; 323/315; 323/316
[58] Field of Search .......... 307/591, 597, 600, 603, 307/605, 608, 262, 228; 328/55, 1

[56] References Cited

U.S. PATENT DOCUMENTS

4,843,265 6/1989 Jiang .................. 307/591

Primary Examiner—Stanley D. Miller
Assistant Examiner—Trong Phan
Attorney, Agent, or Firm—Martin M. Novack

[57] ABSTRACT

A delay circuit for delaying a digital input signal has a ramp generator, a logic circuit which provides a delayed output when the ramp voltage reaches threshold voltage, and a bias circuit which provides bias voltage to the ramp generator so that the delayed output is free from temperature variation, power supply voltage variation and process variation of semiconductor elements.

16 Claims, 10 Drawing Sheets

DELAY CIRCUIT WHICH IS FREE FROM TEMPERATURE VARIATION, POWER SUPPLY VOLTAGE VARIATION AND PROCESS VARIATION

BACKGROUND OF THE INVENTION

The present invention relates to a delay circuit for a digital signal suitable for an integrated circuit, in particular, relates to such a delay circuit which is free from temperature variation, power supply voltage variation and/or variation of the production process. The delay time in the present delay circuit is obtained by charging and/or discharging a capacitor through a current source which uses a MOS field effect transistor (FET) to generate a ramp voltage, and determining the delay time by the time until said ramp voltage reaches a threshold level of a logic circuit.

A delay circuit for delaying a digital signal by a predetermined time is essential in a digital circuit field including a personal computer, and/or a digital measurement apparatus, for adjusting the timing of control signals.

Conventionally, a delay circuit has been implemented by using a hybrid IC circuit having an LC delay element and a logic gate for input/output buffer. However, a delay circuit in the form of a monolithic IC has been desired for producing a miniaturized and/or low cost device.

A delay circuit which is suitable for a monolithic integrated circuit has been known by charging or discharging a capacitor through a current source with a MOS field effect transistor to generate a ramp voltage, and the delay time is defined by the time until the ramp voltage reaches a threshold level of a logic circuit.

FIG. 12 shows a circuit diagram of a prior delay circuit which uses a ramp voltage. In the figure, the symbol $M_1$ is a first MOS field effect transistor, $M_2$ is a second MOS field effect transistor, C is a capacitor, $Q_1$ is a logic circuit, $V_{BIAS}$ is DC bias potential, $V_{DD}$ is DC power supply voltage, $V_{IN}$ is an input terminal of a digital signal which is subject to delay, and $V_{OUT}$ is an output terminal of a delayed signal.

In the above embodiment, the first MOS field effect transistor $M_1$ which is a P channel element, has a gate $G_1$ which is coupled with an input terminal $V_{IN}$, and, a source $S_1$ which is coupled with power supply voltage $V_{DD}$. The second MOS field effect transistor $M_2$ which is N channel element has a drain $D_2$ which is connected to the drain $D_1$ of the first transistor $M_1$, and the source $S_2$ which is grounded. The gate $G_2$ of the second transistor $M_2$ receives the DC (direct current) bias voltage $V_{BIAS}$. The capacitor C is coupled between the point (a) which is junction point of the drains $D_1$ and $D_2$ of two transistors, and the ground. The logic circuit $Q_1$ is coupled with the point (a), and provides a logic output signal depending upon the charge in the capacitor C to provide the delayed output signal $V_{OUT}$. The logic circuit $Q_1$ in the embodiment is implemented by an inverter, which provides low level output when the potential of the point (a) is higher than the threshold level of the inverter, and provides high level output when the potential of the point (a) is lower than said threshold level.

FIG. 13 shows the operational waveforms of the circuit. When an input digital signal $V_{IN}$ is in low level, both the transistors $M_1$ and $M_2$ are active, and the potential on the point (a) is determined by the divisional ratio of the power potential $V_{DD}$ by two transistors $M_1$ and $M_2$. When the ratio (W/L) of the gate width W to the channel length L of the first transistor $M_1$ is considerably large as compared with that of the second transistor $M_2$, the potential at the point (a) is at high level as shown in FIG. 13(b), and the potential is approximately $V_{DD}$. The voltage between the gate and the source of, the first transistor $M_1$ is larger than that of the second transistor $M_2$.

When the digital input signal $V_{IN}$ changes to high level at time $t_0$ as shown in FIG. 13(a), the first transistor $M_1$ becomes to cutoff state, and therefore, the charge on the capacitor C begins to discharge through the second transistor $M_2$. The gate $G_2$ of the second transistor $M_2$ receives the DC bias voltage $V_{BIAS}$, and it functions as a constant current source in the saturation region where the following equation is satisifed.

$$V_{DS} \leq V_{GSN} - V_{TN}$$

where $V_{DS}$ is the voltage between the drain and the source, $V_{GSN}$ is equal to $V_{BIAS}$, and $V_{TN}$ is the threshold voltage.

Accordingly, when the digital input signal $V_{IN}$ changes to high level, the potential at the point (a) decreases with approximate linearly as shown in FIG. 13(b).

The potential on the point (a) is monitored by a logic circuit $Q_1$ which is implemented by an inverter, which changes the output signal $V_{OUT}$ from low level to high level as shown in FIG. 13(c), when the input voltage reaches the threshold voltage $V_{TH}$ at time $t_1$.

The delay time $T_d$ is the duration between the rising edge of the digital input signal $V_{IN}$ and the rising edge of the output signal of the inverter $Q_1$.

The delay time $T_d$ is shown by the following equation.

$$T_d = (V_{DD} - V_{TH}) \cdot C / I_{DN}$$

where $T_{TH}$ which is the threshold voltage of the logic circuit $Q_1$, and is expressed as follows provided that the logic circuit $Q_1$ is implemented by a CMOS inverter.

$$V_{TH} = (\beta V_{DD} + \beta V_{TP} + V_{TN})/(1+\beta)$$

$$\beta = [(L_n \cdot W_p \cdot \mu_p)/L_p \cdot W_n \cdot \mu_n)]^{\frac{1}{2}}$$

where $V_{TN}$ (positive), $L_n$, and $W_n$ are the threshold voltage, channel length, and the gate width, respectively, of the N-channel element which constitutes a CMOS inverter, $\mu_n$ is a mobility of an electron which is a carrier in an N-channel element, $V_{TP}$ (negative), $L_p$, and $W_p$ are the threshold voltage, the channel length, and the gate width, respectively, of the P-channel element which constitutes a CMOS inverter, and $\mu_p$ is the mobility of a positive hole which is the carrier in a P-channel element.

It should be noted in the above equations that the threshold voltage $V_{TH}$ depends upon the source voltage $V_{DD}$. For instance, when $\beta = 1$, $V_{TN} = |V_{TP}|$, then $T_{TH} = 0.5 V_{DD}$.

Further, $I_{DN}$ in said equation for providing the delay time $T_d$ is the drain current of the second transistor $M_2$, and is approximately obtained by the following equation.

$$I_{DN} = (W_N/L_N)(\mu_N C_0/2)(V_{GSN} - V_{TN})^2$$

where $V_{TN}$, $L_N$ and $W_N$ are the threshold voltage, the channel length and the gate width, respectively, of the second transistor $M_2$, $\mu_N$ is the mobility of an electron which is the carrier of the second transistor $M_2$, $C_0$ is the gate capacity for unit area of the second transistor $M_2$.

However, a prior delay circuit as described in FIGS. 12 and 13 has the following disadvantages.

a) As apparent in said equation of $I_{DN}$, when the carrier mobility $\mu_N$ changes, the drain current $I_{DN}$ changes, and then, the delay time $T_d$ changes. The carrier mobility $\mu_N$ becomes small when the temperature becomes high. Therefore, the delay time $T_d$ becomes longer depending upon the temperature rise.

b) As apparent from the equation for the threshold voltage $V_{TH}$, the threshold voltage $V_{TH}$ changes depending upon the channel length $L_p$ or $L_n$, the gate width $W_p$ or $W_n$, the mobility $\mu_n$ or $\mu_p$, and the threshold voltage $V_{Tn}$ or $V_{Tp}$, because of the change of the manufacturing process condition.

Further, as apparent from the equation of $I_{DN}$, the drain current $I_{DN}$ of the second transistor $M_2$ changes, depending upon the channel length $L_N$, the gate width $W_N$, the gate capacity $C_0$, and the threshold voltage $V_{TN}$ because of the manufacturing process change. Thus, the delay time depends upon the error in the production process of transistors.

c) As apparent from the equation of $T_d$, the delay time $T_d$ is proportional to $(V_{DD}-V_{TH})$ which is the difference between the power voltage $V_{DD}$ and the threshold voltage $V_{TH}$ of an inverter, the delay time depends upon the power supply voltage $V_{DD}$.

SUMMARY OF THE INVENTION

It is an object of the present invention to overcome the disadvantages and limitations of a prior delay circuit by providing a new and improved delay circuit.

It is also an object of the present invention to provide a delay circuit which is suitable for implementing an integrated circuit IC.

It is also an object of the present invention to provide a delay circuit in which a delay time is free from errors in the production process, temperature change, and power supply voltage change.

The above and other objects are attained by a delay circuit comprising of at least one ramp generator for providing a ramp voltage starting at digital input signal, a logic circuit accepting said ramp voltage and providing digital output signal which is delayed by a predetermined duration from said digital input signal when said ramp voltage reaches a predetermined threshold voltage, and a bias means for providing bias voltage to said ramp generator; said ramp generator comprising, a switching means comprising a first MOSFET which is switched ON and OFF by said digital input signal, a charge/discharge means comprising a second MOSFET, a resistor which is connected in series to a drain-source circuit of said second MOSFET, and an operational amplifier with an output coupled with a gate of said second MOSFET, a negative input coupled with junction of said resistor and said second MOSFET, and a positive input which accepts a bias voltage, and a capacitor which is charged and/or discharged through said charge/discharge circuit, and provides said ramp voltage across the capacitor; said bias means comprising at least one of means for providing voltage proportional to temperature variation and means for providing voltage proportional to said threshold voltage of said logic circuit.

In one modification, a current mirror circuit is coupled with said charge/discharge means so that a single bias means is enough for a plurality of delay circuits which are subject to compensate temperation change, power supply change, and/or production error.

Still preferably, a pair of delay circuits which receives a common digital input signal in opposite polarity are used to provide a delayed output signal in which both beginning edge and rear edge of an input pulse are delayed.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
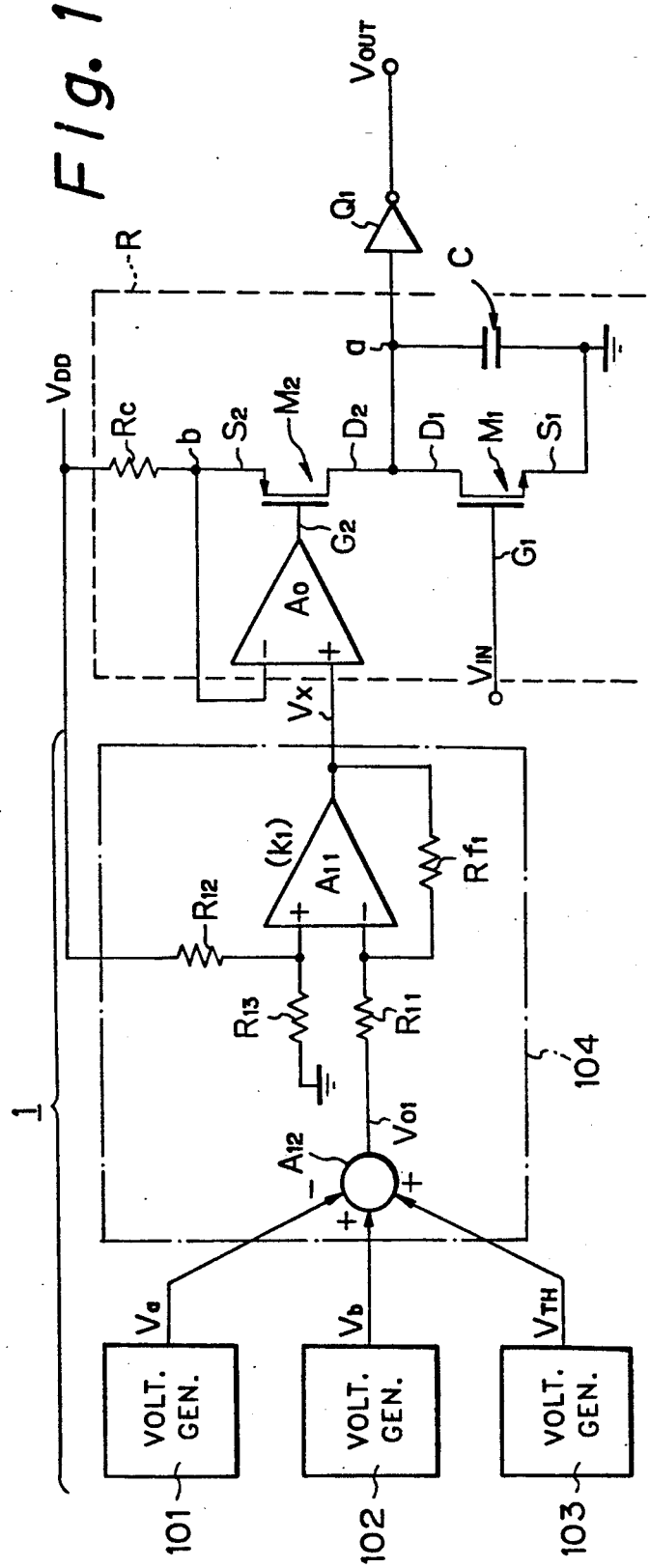
FIG. 1 is a circuit diagram of the delay circuit of the first embodiment according to the present invention.
Figure 12:
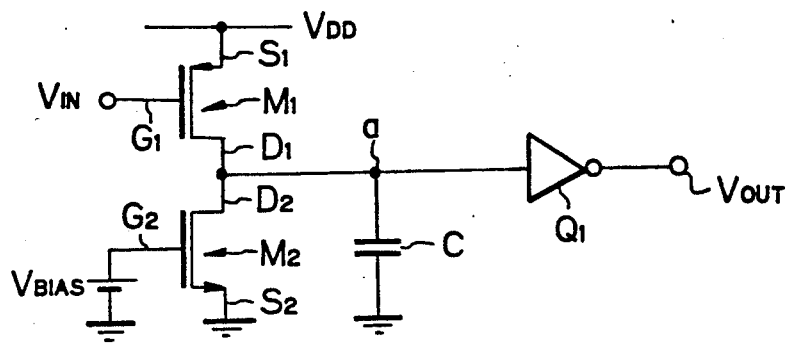
FIG. 12 shows a prior delay circuit.

FIG. 1 shows a circuit diagram of the delay circuit according to the present invention. The same reference numerals as those in FIG. 12 show the same members.

The basic idea of the present invention to provide a delay time which is free from temperature change, power supply voltage variation, and process variation is (1) the use of a resistor $R_c$ inserted one end of a transistor and power supply (or ground), and to keep constant current in the resistor $R_c$ and (2) to compensate for the change of the threshold level of the inverter $Q_1$, by adjusting the bias voltage which is applied to the gate of the second transistor $M_2$.

In FIG. 1, the symbol R shows a ramp generator for providing a ramp voltage starting with a digital input signal $V_{IN}$, and $Q_1$ shows an inverter which provides a digital output signal $V_{OUT}$ when said ramp voltage reaches the predetermined threshold voltage of the inverter. The ramp generator R has a switching means implemented by a first MOSFET $M_1$ which is switched ON and OFF by a digital input signal $V_{IN}$, a charge/discharge circuit having a resistor $R_c$, a second MOSFET $M_2$ and an operational amplifier $A_O$, and a capacitor C coupled with power supply voltage $V_{DD}$ through said charge/discharge circuit. The operational amplifier $A_O$ receives the bias voltage $V_x$ which compensates temperature variation, power supply variation, and process variation.

The first MOSFET (metal oxide semiconductor field effect transistor) $M_1$ is composed of an N-channel element, with a gate $G_1$ coupled with a digital input signal $V_{IN}$ which is subject to delay, and a source $S_1$ which is grounded as one port of the power supply.

The second MOSFET $M_2$ is composed of a P-channel element with a drain $D_2$ coupled with a drain $D_1$ of the first transistor $M_1$, and a source $S_2$ coupled with the power supply voltage $V_{DD}$ through the resistor $R_c$. The power supply voltage $V_{DD}$ is DC voltage for operating the delay circuit.

The operational amplifier $A_0$ has a positive input (+), a negative input (−), and an output which is coupled with the gate $G_2$ of the second transistor $M_2$. The negative input (−) is coupled with the junction of the source $S_2$ of the second transistor $M_2$ and the resistor $R_c$.

The numeral 1 shows a bias means for providing a voltage $V_x$ to the operational amplifier $A_0$. The bias means 1 comprises a first compensation voltage generator 101 which provides the voltage $V_a$ which is not affected by temperature change, a second compensation voltage generator 102 which provides the voltage $V_b$ which changes linearly according to temperature change, a third compensation voltage generator 103 which provides the threshold voltage $V_{TH}$ of the logic circuit $Q_1$, and the voltage combiner 104 which combines the voltages $V_a$, $V_b$, $V_{TH}$, and the power supply voltage $V_{DD}$. The voltage combiner 104 has an operational amplifier $A_{11}$, and a voltage adder $A_{12}$.

The operational amplifier $A_{11}$ functions as an adder, having a negative input terminal (−) connected to the voltage adder $A_{12}$ through the resistor $R_{11}$ and the positive input terminal (+) which is coupled with the power supply voltage $V_{DD}$ through the resistor $R_{12}$ and grounded through the resistor $R_{13}$. The resistor $R_{f1}$ is connected between the negative input terminal (−) and the output of the amplifier $A_{11}$. The output of the amplifier $A_{11}$ provides the bias voltage $V_x$ which is applied to the positive input of the operational amplifier $A_0$. The resistance of the resistors $R_{f1}$ and $R_{12}$ is selected to be $(K_1 \cdot R_{a1})$ where $R_{a1}$ is resistance of the resistors $R_{11}$ and $R_{13}$, and $K_1$ is constant.

The voltage adder $A_{12}$ provides the combined DC sum $V_{01}$ as follows.

$$V_{01} = V_{TH} + V_b - V_a$$

The sum $V_{01}$ of the output of the voltage adder $A_{12}$ is applied to the negative input (−) of the operational amplifier $A_{11}$ through the resistor $R_{11}$. The positive input (+) of the operational amplifier $A_{11}$ receives the input voltage which divides the power supply voltage $V_{DD}$ by the resistors $R_{12}$ and $R_{13}$. Thus, the output $V_x$ of the operational amplifier $A_{11}$ is;

$$V_x = V_{DD} - K_1 V_{01}$$

The voltage $V_x$ which is the output of the operational amplifier $A_{11}$ is applied to the positive input (+) of the operational amplifier $A_0$, which functions so that the voltages at two input terminals (−) and (+) are equal to each other. Therefore, the junction (b) of the source $S_2$ of the second FET $M_2$ and the resistor $R_2$ is at the potential equal to $V_x$.

Figure 2:
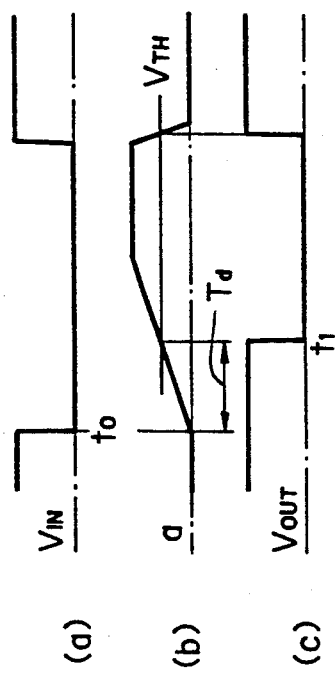
FIG. 2 shows operational waveforms in the circuit of FIG. 1.

FIG. 2 shows the operational waveforms of the apparatus of FIG. 1. When a digital input signal $V_{in}$ (FIG. 2(a)) is at high level, both the FET's $M_1$ and $M_2$ are in active state. Provided that the ratio (W/L) of the gate width W to the channel length L of the first FET $M_1$ is sufficiently larger than than (W/L) of the second FET $M_2$, then, the voltage between the gate and the source of the first FET $M_1$ is higher than that of the second FET $M_2$, the potential at the point (a) which is the junction of the drains $D_1$ and $D_2$ of two FET's is at low level (0 volt) as shown in FIG. 2(b).

When the digital input signal $V_{IN}$ turns to low level at the time $t_0$ as shown in FIG. 2(a), the first FET $M_1$ goes to a cutoff state, and the capacitor C is charged through the resistor $R_c$ and the second FET $M_2$. Therefore, the potential at the point (a) at one end of the capacitor C increases as shown in FIG. 2(b). The potential at the point (a) is applied to the inverter $Q_1$, which turns an output signal from high level to low level at the time $t_1$ when the potential at the point (a) reaches the threshold level $V_{TH}$ of the inverter $Q_1$ as shown in FIG. 2(c).

The delay time $T_d$ is the time between $t_0$ and $t_1$ until the inverter $Q_1$ provides an output signal $V_{OUT}$, and is expressed as follows.

$$T_d = (V_{TH} \cdot C)/I_{DP}$$

where $I_{DP}$ is drain current of the second FET $M_2$, and is equal to the charge current of the capacitor C.

Since the operational amplifier $A_0$ functions to adjust the potential at the point (b) which is the junction of the source $S_2$ of the second FET $M_2$ and the resistor $R_c$ equal to the potential $V_x$, the current $I_{DP}$ is expressed as follows.

$$I_{DP} = (V_{DD} - V_x)/R_c$$

It should be noted in the above equation that the use of the operational amplifier $A_0$ which provides the potential $V_x$ at one end of the resistor $R_c$ removes the delay time error because of the process error of a semiconductor, since the current $I_{DP}$ is determined only by $V_{DD}$ and $R_c$, but is free from mobility, and/or gate capacitance of semiconductor elements.

The delay time $T_d$ is expressed as follows.

$$\begin{aligned} T_d &= V_{TH} \cdot C/I_{DP} \\ &= V_{TH} \cdot C/[(V_{DD} - V_x)/R_c] \\ &= V_{TH} \cdot R_c \cdot C/(V_{DD} - V_x) \\ &= C \cdot R_0 \cdot [1 + \alpha(T - T_0)] \cdot V_{TH}/(V_{DD} - V_x) \end{aligned} \quad (1)$$

In order to prevent the change of $T_d$ by the change of the source voltage and temeperature, $(V_{DD} - V_x)$ must be proportional to $V_{TH}$, and the temperature coefficient of $(V_{DD} - V_x)$ must be equal to the temperature coefficient $\alpha$ of the resistor $R_c$.

In other words, the bias voltage $V_x$ must satisfy the following equation (2).

$$(V_{DD} - V_x) = K_1[V_{TH} + K_0(T - T_0)] \quad (2)$$

In the equation (2), $(V_{DD}-V_x)$ which is the denominator of the equation (1) has the positive temperature coefficient $K_0(V/°C.)$, and has the value $K_1 \cdot V_{TH}$ which is proportional to the threshold voltage $V_{TH}$ at the reference temperature $T_0$. The value $K_1$ is constant.

The delay time $T_d$ is then obtained by the equation (3) by combining the equations (2) and (1).

$$T_d = C \cdot R_0[1+\alpha(T-T_0)]V_{TH}/[K_1(V_{TH}+K_0(T-T_0))] = C \cdot R_0[1+\alpha(T-T_0)]V_{TH}/[K_1 V_{TH}(1+\beta(T-T_0))] \quad (3)$$

where $\beta = K_0/V_{TH}$.

Provided that $K_0 = \alpha \cdot V_{TH}$, and $\alpha = \beta$ are satisfied, the delay time $T_d$ is;

$$T_d = C \cdot R_0/K_1 \quad (4)$$

The equation (4) shows that the delay time $T_d$ is free from temperature variation, power voltage variation, and process variation.

Figure 3:
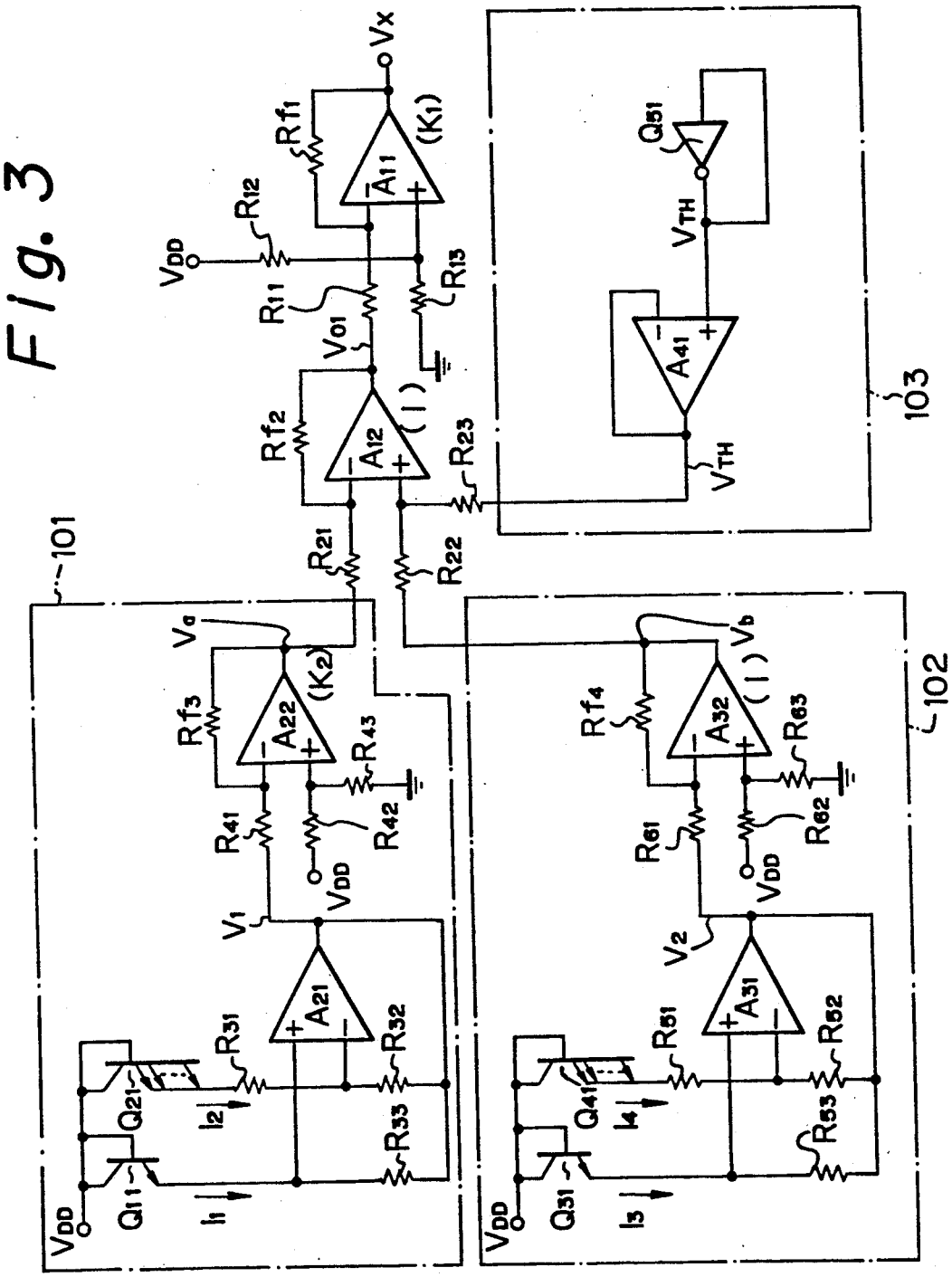
FIG. 3 shows a circuit diagram of a bias means 1 in FIG. 1.

FIG. 3 shows a circuit diagram of the bias means 1 which provides the bias voltage $V_x$ for satisfying above equations (2) through (4). The first compensation voltage generator 101 which provides the voltage $V_a$ which is free from temperature change has an operational amplifier $A_{21}$, a pair of bipolar transistors $Q_{11}$ and $Q_{21}$ having the different emitter area from each other in diode connection, the resistors $R_{31}$, $R_{32}$ and $R_{33}$, and the other operational amplifier $A_{22}$. The operational amplifier $A_{21}$ has the positive input connected to the emitter of the bipolar transistor $Q_{11}$, and the negative input (−) connected to the junction of the resistors $R_{31}$ and $R_{32}$.

The operational amplifier $A_{22}$ has the negative input (−) connected to the output of the operational amplifier $A_{21}$ through the resistor $R_{41}$, and the positive input (+) connected to the power source $V_{DD}$ through the resistor $R_{42}$ and the ground through the resistor $R_{43}$. The output of the amplifier $A_{22}$ is connected to the negative input (−) through the feedback resistor $R_{f3}$. The resistance of the resistors $R_{43}$ and $R_{f3}$ is selected to be $K_2 \cdot R_{a2}$ where $R_{a2}$ is the resistance of the resistors $R_{41}$ and $R_{42}$.

The second compensation voltage generator 102 for generating the voltage $V_b$ which changes linearly according to temperature change has the operational amplifier $A_{31}$, a pair of bipolar transistors $Q_{31}$ and $Q_{41}$ having the different emitter area from each other in diode connection, the resistors $R_{51}$, $R_{52}$ and $R_{53}$, and the operational amplifier $A_{32}$. The operational amplifier $A_{31}$ has the positive input (+) connected to the emitter of the bipolar transistor $Q_{31}$, and the negative input (−) connected to the junction of the resistors $R_{51}$ and $R_{52}$. The operational amplifier $A_{32}$ has the negative input (−) connected to the output of the amplifier $A_{31}$ through the resistor $R_{61}$, and the positive input (+) connected to the power source voltage $V_{DD}$ through the resistor $R_{62}$ and the ground through the resistor $R_{63}$. The output of the amplifier $A_{32}$ is connected to the negative input through the feedback resistor $R_{f4}$. The resistance of the resistors $R_{61}$ through $R_{63}$, and the feedback resistor $F_{f4}$ is essentially the same as one another ($=R_{a3}$).

The third compensation voltage generator 103 for providing the threshold voltage $V_{TH}$ of the inverter $Q_1$ has a logic circuit $Q_{51}$ and an operational amplifier $A_{41}$. The logic circuit $Q_{51}$ is the same inverter as the inverter $Q_1$, mounted on the same semiconductor substrate as that of $Q_1$. The output of the inverter $Q_{51}$ is connected to the input of the same. It should be noted that the output of the all feedback type inverter in which the output is connected to the input, is equal to the threshold voltage of the own inverter. Therefore, the logic circuit $Q_{51}$ provides the threshold voltage $V_{TH}$ of the inverter $Q_1$. The output of the inverter $Q_{51}$ is applied to the positive input of the operational amplifier $A_{41}$ which composes an impedance converter with the unit gain in the unity feedback connection so that the threshold voltage $V_{TH}$ is output with low impedance.

The combiner 104 has the operational amplifiers $A_{11}$ and $A_{12}$. The operational amplifier $A_{12}$ has the negative input (−) connected to the output $V_a$ of the means 101 which provides the voltage $V_a$ free from temperature, and the positive input (+) connected to the output $V_b$ which changes linearly according to temperature change through the resistor $R_{22}$ and the threshold voltage $V_{TH}$ through the resistor $R_{23}$. The resistor $R_{f2}$ is a feedback resistor. The resistance of the resistors $R_{21}$ through $R_{23}$ and $F_{f2}$ is essentially the same as one another ($=R_{a4}$).

In the above structure, the output voltage $V_1$ of the operational amplifier $A_{21}$ in the compensation voltage generator 101, and the output voltage $V_2$ of the operational amplifier $A_{31}$ of the second compensation voltage generator 102, are expressed as follows, respectively.

$$V_1 = V_{DD} - [V_{BE1} + V_{p1}(T)] \quad (5)$$

$$V_2 = V_{DD} - [V_{BE3} + V_{p2}(T)] \quad (6)$$

where;
$V_{p1}(T) = (kT/q)(R_{32}/R_{31})\ln[(I_1/I_2)(S_2/S_1)] = (kT/q)(R_{32}/R_{31})\ln[(R_{32}/R_{31})(S_2/S_1)]$
$V_{p2}(T) = (kT/q)(R_{52}/R_{51})\ln[I_3/I_4)(S_4/S_3)] = (kT/q)(R_{52}/R_{51})\ln[R_{52}/R_{53})(S_4/S_3)]$
k; Boltzmann's constant
T; absolute temperature
q; charge of an electron
$S_1$; area of an emitter of a bipolar transistor $Q_{11}$
$S_2$; area of an emitter of a bipolar transistor $Q_{21}$
$S_3$; area of an emitter of a bipolar transistor $Q_{31}$
$S_4$; area of an emitter of a bipolar transistor $Q_{41}$
$V_{BE1}$; voltage between a base and an emitter of a bipolar transistor $Q_{11}$
$V_{BE3}$; voltage between a base and an emitter of a bipolar transistor $Q_{31}$ It should be appreciated that voltages $V_{BE1}$ and $V_{BE3}$ have the negative temperature coefficient about −2 mV/°C., and $V_{p1}(T)$ and $V_{p2}(T)$ are proportional to absolute temperature (T).

According to the present invention, the voltage $V_1$ is determined so that the temperature coefficient in the equation (5) is zero, and $V_2$ is determined so that the temperature coefficient in the equation (6) is constant ($K_0 = \alpha V_{TH}$ mV/°C.).

The conditions that the temperature coefficient of $V_1$ is zero are as follows n the equation (5).

$(\alpha V_{BE1}/\alpha T) + (\alpha V_{p1}(T)/\alpha T) = 0$, and $(\alpha V_{BE1}/\alpha T) + (k/q)(R_{32}/R_{31})\ln[(R_{32}R_{33})(S_2/S_1)] = 0$ Assuming that;

$(\alpha V_{BE1}/\alpha T) = -2 \ [mV/°C.]$, $R_{32} = R_{33}$, and $S_2/S_1 = 10$ then, the temperature coefficient of $V_{BE1}+V_{p1}(T)$ is zero by designing the ratio $R_{32}/R_{33}$ as follows.

$$R_{32}/R_{31} = -(\alpha V_{BE1}/\alpha T)/[(k/q)ln[(R_{32}/R_{33})(S_2/S_1)]] = 2.0/[(0.085)ln(10)] = 10$$

Assuming that the reference temperature $T_0$ is 300° K. (absolute temperature), and $V_{BE1}$ at that reference temperature is 0.7 V, then, the following equation is satisfied.

$$V_{BE1}(T_0)+V_{p1}(T_0) = 0.7+(0.085 \cdot 10^{-3})(300)(10)ln(10) = 1.3 \, [V]$$

That voltage is free from the temperature change and the power supply voltage change, and is defined as a constant voltage $V_{REF1}$, and then, $$V_1 = V_{DD} - V_{REF1}$$

On the other hand, the conditions that $V_2$ has the temperature coefficient $K_0$ (mV/°C.) in the equation (6) are as follows.

$$(\alpha V_{BE3}/\alpha T) + (\alpha V_{p2}(T)/\alpha T) = K_0, \text{ and}$$

$$(\alpha V_{BE3}/\alpha T) + (k/q)(R_{52}/R_{51})ln[(R_{52}/R_{53})(S_4/S_3)] = k_0$$

where $K_0 = \alpha V_{TH}$.

Assuming in a numerical embodiment that $\alpha = 800$ [ppm/°C., and $V_{TH} = 2.5$ V, then, $$K_0 = \alpha V_{TH} = 2.0 \, [mV/°C]$$

Assuming that $(\alpha B_{RE3}/\alpha T) = -2$ (mV/°C.), and $R_{52} = R_{53}$, and $S_4/S_3 = 20$, then, the ratio of $R_{52}/R_{51}$ for satisfying above conditions is;

$$R_{52}/R_{51} = [K_0 - \alpha V_{BE3}/\alpha T]/((k/q)ln((R_{52}/R_{53})(S_4/S_3))) = (2.0-(-2.0))/(0.085)ln(20) = 16$$

Therefore, when $R_{52}=R_{53}$, $S_4/S_3=20$, and $R_{52}/R_{51}=16$, the temperature coefficient of $V_{BE3}+V_{p2}(T)$ is;

$$\alpha V_{TH} = +2.0 \, [mV/°C]$$

Since the voltage $V_2$ includes the power supply voltage $V_{DD}$, that power supply voltage $V_{DD}$ is subtracted from $V_2$ by using the operational amplifier $A_{32}$, which provides the output $V_b$;

$$V_b = V_{DD} - V_2 = V_{BE3} + V_{p2}(T)$$

That voltage $V_b = V_{BE3} + V_{p2}(T)$ has the temperature coefficient $\alpha V_{TH} = +2.0$ mV/°C.

Next, the offset voltage $V_b(T_0)$ is subtracted from $V_b$ in order to provide the compensation voltage with the temperature coefficient $K_0$, and the value zero (0) at the reference temperature ($T_0$), as shown in the equation (2). That offset voltage is derived from the reference voltage $V_{REF1}$ obtained in the first compensation voltage generator 101.

As the voltage $V_1$ in the first compensation voltage generator 101 includes the power supply voltage $V_{DD}$, the operational amplifier $A_{22}$ effects the subtraction $V_{DD}-V_1$, and provides the factor $K_2$.

$$V_a = K_2(V_{DD} - V_1) = K_2 \cdot V_{REF1}$$

The factor $K_2$ must satisfy the following condition so that $V_b(T_0) = V_{BE3}(T_0) + V_{p2}(T_0)$ is satisfied (the value $V_b$ is zero at reference temperature $T_0$).

$$K_2 \cdot V_{REF1} = V_{BE3}(T_0) + V_{p2}(T_0) = V_{BE3}(T_0) + (k/q)(R_{52}/R_{51})(T_0)ln[(R_{52}/R_{53})(S_4/S_3)]$$

Assuming that $V_{BE3}(T_0) = 0.7$ V, $R_{52} = R_{53}$, $S_4/S_3 = 20$, $R_{52}/R_{51} = 16$, and $V_{REF1} = 1.3$ V, then, the value $K_2$ is obtained as follows.

$$K_2 \cdot V_{REF1} = V_{BE3}(T_0) + (k/q)(R_{52}/R_{51})(T_0)ln[(R_{52}/R_{53})(S_4/S_3)] = 1.9$$

$$K_2 = 1.9/V_{REF1} = 1.9/1.3 = 1.5$$

The operational amplifier $A_{12}$ functions as an adder, providing the output voltage $V_{01}$:

$$\begin{aligned} V_{01} &= V_{TH} + (V_b - V_a) \\ &= V_{TH} + [V_{BE3}(t) + V_{p2}(T)] - [V_{BE3}(T_0) + V_{p2}(T_0)] \\ &= V_{TH} + \alpha V_{TH}(T - T_0) \end{aligned}$$

Thus, the operational amplifier $A_{12}$ effects the subtraction $V_b - V_a$, and the threshold voltage $V_{TH}$ which is the output of the operational amplifier $A_{41}$ is added to the difference $V_b - V_a$.

The operational amplifier $A_{11}$ effects the subtraction and the output $V_x$ is;

$$\begin{aligned} V_x &= V_{DD} - K_1 V_{01} \\ &= V_{DD} - K_1[V_{TH} + \alpha V_{TH}(T - T_0)] \\ &= V_{DD} - K_1 V_{TH}[1 + \alpha(T - T_0)] \end{aligned}$$

The value $V_x$ is obtained by applying $V_{DD}$ to the positive input and $V_{01}$ to the negative input of the operational amplifier $A_{11}$. The factor $K_1$ is determined by the resistance of the resistors $R_{11}$ through $R_{13}$ and the feedback resistor $R_{f1}$.

It is preferable that the factor $K_1$ is less than 1 ($K_1 < 1$) so that the ramp voltage has some desired level, considering the dynamic range of the operational amplifier $A_0$, and the ratio (W/L) in size of the second FET $M_2$, and that the voltage drop in the resistor $R_c$ is preferably low.

The npn bipolar transistors $Q_{11}$, $Q_{21}$, $Q_{31}$ and $Q_{41}$ are produced through P well C-MOS process with an emitter by an n+ diffusion layer which is produced through the same steps as those of a source/drain of an N channel MOS FET, a base with a P well, and a collector with an N type substrate.

It should be noted in FIGS. 1 through 3 that the use of only compensation means 101 and 102 is useful for compensating only temperature change. Similarly, the use of only the compensation means 103 is useful for compensating the change of the threshold voltage. Of course, when those three means 101, 102 and 103 are used, both the temperature change and threshold voltage change are compensated for.

Figure 4:
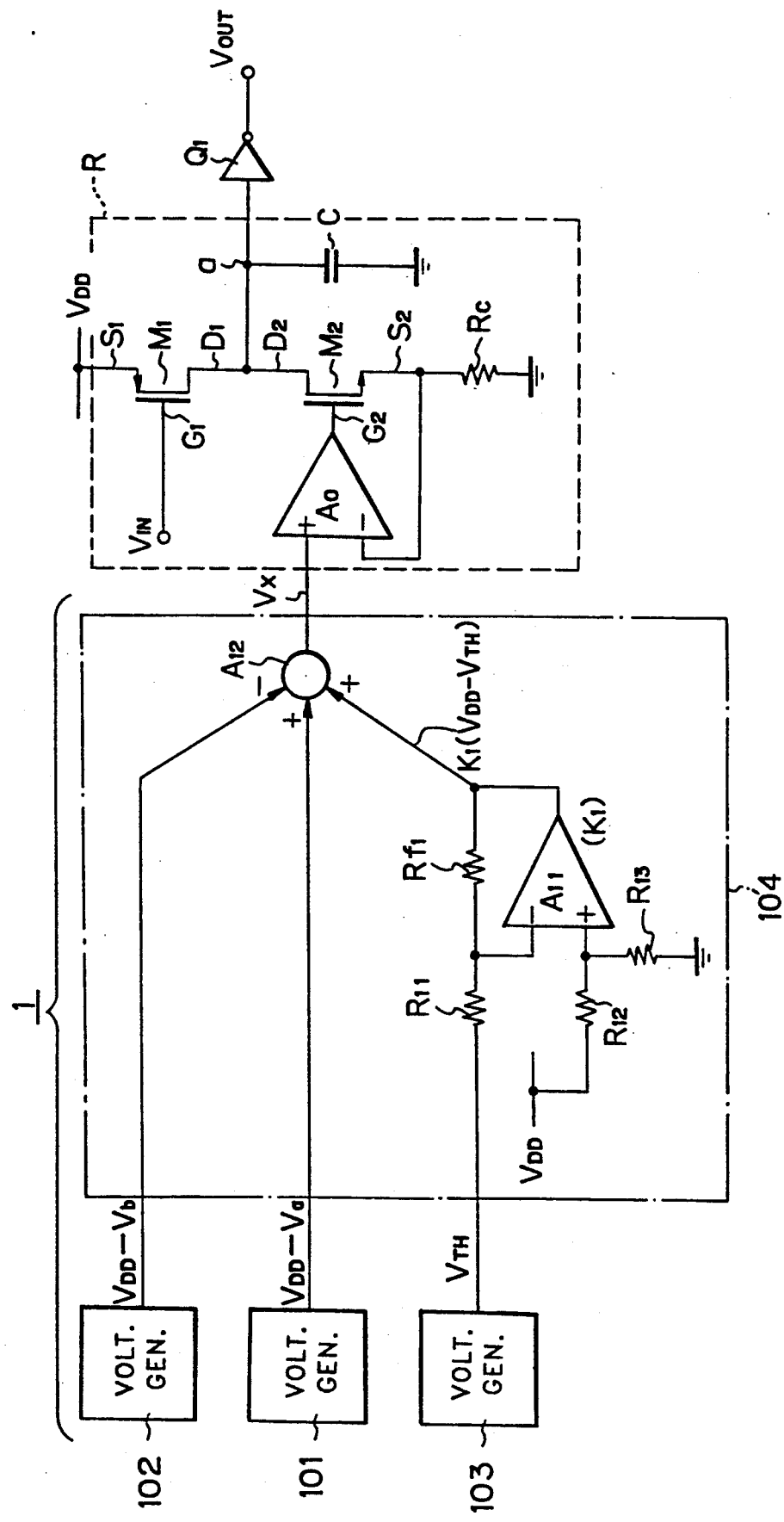
FIG. 4 is a circuit diagram of another embodiment according to the present invention.

FIG. 4 shows a circuit diagram of another embodiment of the present invention. In FIG. 4, the same numerals as those in FIG. 1 show the same members. The feature of FIG. 4 as compared with FIG. 1 is that the resistor $R_c$ is coupled in the ground side, instead of the power source side.

Figure 13:
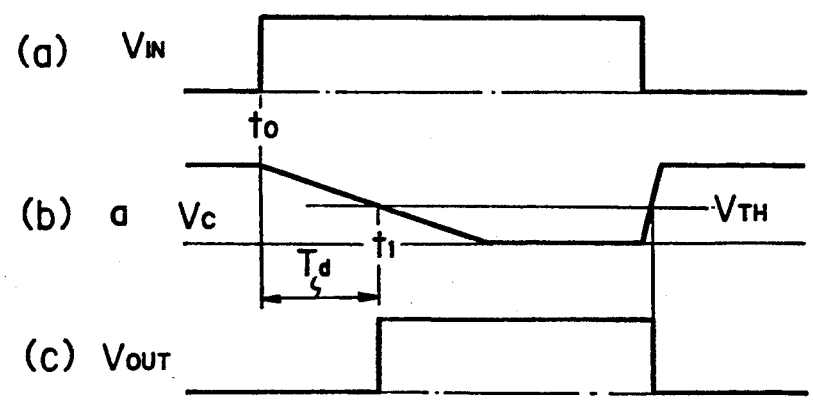
FIG. 13 shows operational waveforms of the circuit of FIG. 12.

The ramp voltage in FIG. 4 is decreasing in voltage as shown in FIG. 13, while the ramp voltage in FIG. 1 is increasing in voltage as shown in FIG. 2(b).

The first MOSFET $M_1$ is composed of a P-channel element with a gate $G_1$ accepting an input digital signal $V_{IN}$ which is subject to be delayed, and a source $S_1$ connected to the power supply voltage $V_{DD}$.

The second MOSFET $M_2$ is composed of an N-channel element, with a drain $D_2$ connected to the drain $D_1$ of the first FET $M_1$, the source $S_2$ grounded through the resistor $R_c$.

In this embodiment, the capacitor C is charged when the digital input signal $V_{IN}$ is in low level and the first FET $M_1$ is conducted, and said capacitor C is discharged through the second FET $M_2$ and the resistor $R_c$ provides a ramp voltage when the digital input signal $V_{IN}$ is in high level and the first FET $M_1$ is in cutoff state. The voltage across the capacitor C, or the potential at the point (a) is converted to a digital form by a logic circuit $Q_1$ which has the threshold voltage $V_{TH}$, and provides the delayed signal. The operational waveforms in FIG. 4 are the same as those in FIG. 13.

The bias means 1 has a first voltage generator 101 which provides a compensation voltage $V_a$ free from temperature variation, a second voltage generator 102 which provides a compensation voltage $V_b$ which is linear to temperature variation, a third voltage generator 104 which provides the threshold voltage $V_{TH}$ of the inverter $Q_1$, and a voltage combiner 104.

The operational amplifier $A_0$ has the positive input (+) and the negative input (−) and the output. The negative input (−) is connected to the source $S_2$ of the second FET $M_2$, the output is connected to the gate $G_2$ of the second FET $M_2$.

The voltage combiner 104 provides the DC voltage $V_x$ by using the outputs of the means 101, 102, 103, and the power source voltage $V_{DD}$.

The voltage combiner 104 has an operational amplifier $A_{11}$ and a voltage adder $A_{12}$. The operational amplifier $A_{11}$ composes an adder with a negative input (−) connected to the threshold voltage $V_{TH}$ through the resistor $R_{11}$, and a positive input (+) connected to the power supply voltage $V_{DD}$ through the resistor $R_{12}$, and grounded through the resistor $R_{13}$. The output of the amplifier $A_{11}$ is connected to the negative input (−) through the resistor $R_{f1}$, and applied to said voltage adder $A_{12}$. The resistance of the resistors $R_{f1}$ and $R_{13}$ is designed to be $K_1 \cdot R_{a1}$, where $R_{a1}$ is the resistance of the resistors $R_{11}$ and $R_{12}$, and $K_1$ is constant. The output of the operational amplifier is $K_1(V_{DD}-V_{TH})$.

The voltage adder $A_{12}$ provides the DC voltage $V_x$ as follows.

$$V_x = K_1(V_{DD}-V_{TH}) + (V_{DD}-V_a) - (V_{DD}-V_b) = K_1(V_{DD}-V_{TH}) + V_b - V_a$$

The DC voltage $V_x$ is applied to the positive input (+) of the operational amplifier $A_0$, which provies the bias voltage to the second FET $M_2$ so that the potential at the resistor $R_c$ is equal to the DC voltage $V_x$.

The delay time $T_d$ in FIG. 4 is shown below.

$$T_d = (V_{DD}-V_{TH}) \cdot C/I_{DN}$$

where $I_{DN}$ is drain current of the second FET $M_2$, and is the discharge current from the capacitor C.

As the voltage across the resistor $R_c$ is $V_x$, the discharge current $I_{DN}$ is;

$$I_{DN} = V_x/R_c$$

Therefore, the delay time $T_d$ is;

$$\begin{aligned}T_d &= (V_{DD} - V_{TH}) \cdot C/I_{DN} \\ &= (V_{DD} - V_{TH}) \cdot R_c \cdot C/V_x \\ &= C \cdot R_0 \cdot [1 + \alpha(T - T_0)] \cdot (V_{DD} - V_{TH})/V_x\end{aligned} \quad (7)$$

where $\alpha$ is temperature coefficient of the resistor $R_c$, and is expressed as follows.

$$\alpha = (1/R_c)(\partial R_c/\partial T)$$

$R_0$ is the resistance of the resistor $R_c$ at the reference temperature $T_0$.

It should be noted in the above equations that the conditions to have delay time free from temperature variation are that the voltage $V_x$ is proportional to the voltage $(V_{DD}-V_{TH})$, and that the temperature coefficient of the voltage $V_x$ is equal to the temperature coefficient $\alpha$ of the resistor $R_c$. In other words, the voltage $V_x$ must be expressed as follows, where $K_0$ is positive temperature gradient (V/°C.), and $K_1$ is constant.

$$V_x = K_1 + (V_{DD}-V_{TH}) + K_0(T-T_0) \quad (8)$$

When the relation of the equation (8) is inserted into the equation (7), the following equation is obtained.

$$T_d = C \cdot R_0 [1+\alpha(T-T_0)] \cdot (V_{DD}-V_{TH})/[K_1(V_{DD}-V_{TH}) + (T-T_0)] = C \cdot R_0 [1+\alpha(T-T_0)] \cdot (V_{DD}-V_{TH})/[K_1(V_{DD}-V_{TH})[1+\beta(T-T_0)]] \quad (9)$$

where $\beta = K_0/[K_1(V_{DD}-V_{TH})]$ When $K_0 = \alpha \cdot K_1(V_{DD}-V_{TH})$, and $\alpha = \beta$ are satisfied, the delay time $T_d$ is expressed as follows, and that delay time $T_d$ is free from temperature variation, power supply voltage, and producing process.

$$T_d = C \cdot R_0/K_1 \quad (10)$$

Figure 5:
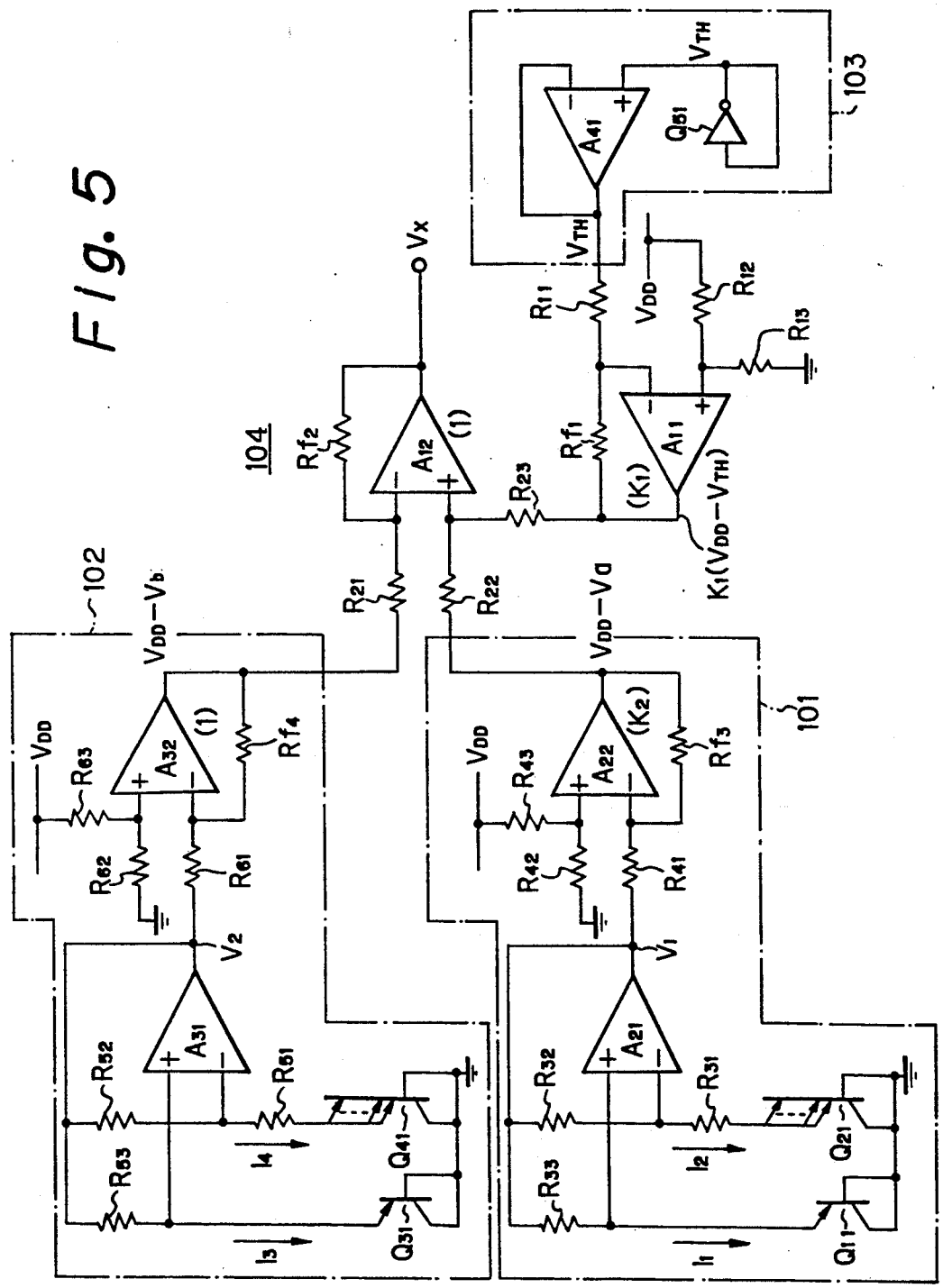
FIG. 5 is a circuit diagram of a bias means 1 in FIG. 4.

FIG. 5 shows a circuit diagram of the bias means 1, which satisfies the above conditions in the equations 8 through 10.

The voltage generator 101 which provides the voltage $V_1$ free from the power supply voltage variation has an operational amplifier $A_{21}$, a pair of pnp bipolar transistors $Q_{11}$ and $Q_{21}$ having different emitter area from each other in diode connection, resistors $R_{31}$, $R_{32}$ and $R_{33}$, and another operational amplifier $A_{22}$. The operational amplifier $A_{21}$ has a positive input (+) connected to an emitter of a bipolar transistor $Q_{11}$, and a negative input (−) connected to a junction of the resistors $R_{31}$ and $R_{32}$. The operational amplifier $A_{22}$ has a negative input (−) connected to output of the operational amplifier $A_{21}$ through the resistor $R_{41}$, and the positive input (+) connected to the power supply voltage $V_{DD}$ through the resistor $R_{43}$ and is grounded through the resistor $R_{42}$. The output of the amplifier $A_{22}$ is connected to the negative input (−) through the resistor $R_{f3}$. The resistance of the resistors $R_{43}$ and $R_{f3}$ is $(K_2 \cdot R_{a2})$ where $R_{a2}$ is resistance of the resistors $R_{41}$ and $R_{42}$.

The voltage generator 102 for providing the voltage $V_2$ which is linear to temperature change has an operational amplifier $A_{31}$, a pair of npn bipolar transistors $Q_{31}$, and $Q_{41}$, the resistors $R_{51}$, $R_{52}$ and $R_{53}$, and the other operational amplifier $A_{32}$. The operational amplifier $A_{31}$ has a positive input (+) connected to an emitter of the bipolar transistor $R_{53}$, and a negative input (−) connected to a junction of the resistors $R_{51}$ and $R_{52}$. The operational amplifier $A_{32}$ has a negative input (−) connected to an output of the operational amplifier $A_{31}$ through the resistor $R_{61}$, and a positive input (+) connected to the power supply voltage $V_{DD}$ through the resistor $R_{63}$ and is grounded through the resistor $R_{62}$. The output of the operational amplifier $A_{32}$ is connected to the negative input (−) through the feedback resistor $R_{f4}$. The resistance of the resistors $R_{61}$ through $R_{63}$, and the resistors $R_{f4}$ is the same as one another, and is expressed as $R_{a3}$.

The voltage generator 103 for taking the threshold voltage $V_{TH}$ of the logic circuit $Q_1$ has the logic circuit $Q_{51}$, and the operational amplifier $A_{41}$. The logic circuit $Q_{51}$ is similar to the logic circuit $Q_1$ in FIG. 4, and the output of $Q_{51}$ is connected to the input of the same. The output voltage of a full feedback type inverter which connects the output to the input is equal to the threshold voltage of the inverter itself. So, the logic circuit $Q_{51}$ provides the voltage which is essentially equal to the threshold voltage $V_{TH}$ of the logic circuit $Q_1$.

The output $V_{TH}$ is applied to the positive input (+) of the operational amplifier $A_{41}$, which constitutes an impedance converter with unit gain by unity feedback connection, and provides the low impedance output voltage $V_{TH}$.

The voltage combiner 104 has operational amplifiers $A_{11}$ and $A_{12}$. The operational amplifier $A_{11}$ has a negative input (−) connected to the output of the operational amplifier $A_{41}$, and a positive input (+) connected to the power voltage $V_{DD}$ through the resistor $R_{12}$ and is grounded through the resistor $R_{13}$ The resistor $R_{f1}$ is a feedback resistor. The resistance of the resistors $R_{13}$ and $R_{f1}$ is designed to be $K_1 \cdot R_{a1}$, where $R_{a1}$ is the resistance of the resistors $R_{11}$ and $R_{12}$. The operational amplifier $A_{12}$ has a negative input (−) connected to the output of the operational amplifier $A_{32}$ through the resistor $R_{21}$, and a positive input (+) connected to the output of the operational amplifier $A_{22}$ through the resistor $R_{22}$, and to the output of the operational amplifier $A_{11}$ through the resistor $R_{23}$. The resistor $R_{f2}$ is a feedback resistor. The resistance of the resistors $R_{21}$ through $R_{23}$, and $R_{f2}$ is the same as one another, and is $R_{a4}$.

The operation of the embodiment of FIGS. 4 and 5 is similar to that of FIGS. 1 through 3.

The embodiment of FIGS. 1 through 3 is suitable to an N well C-MOS process, and the embodiment of FIGS. 4 and 5 is suitable to a P well C-MOS process.

Figure 6:
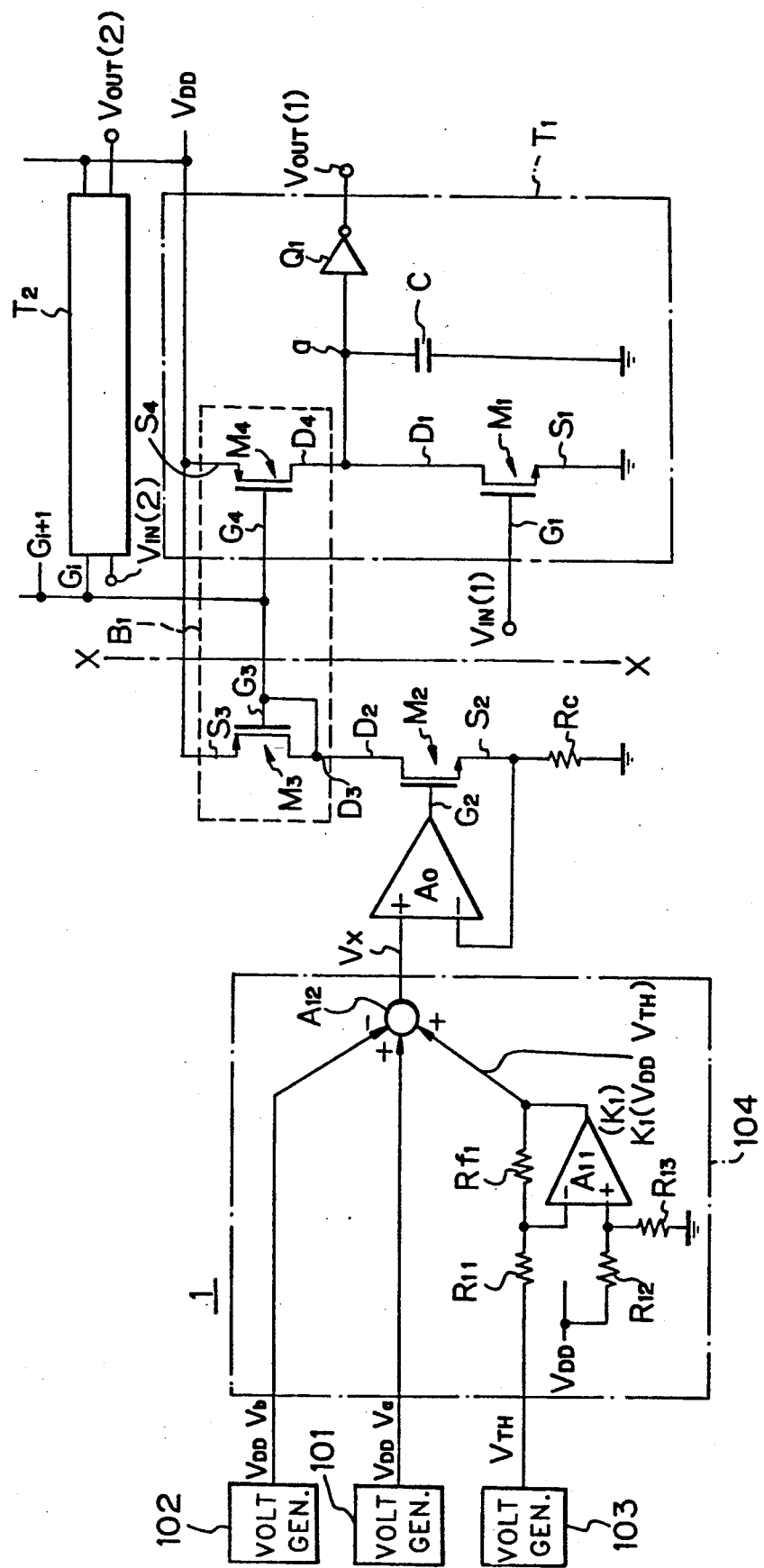
FIG. 6 is a circuit diagram of still another embodiment of the delay circuit according to the present invention.

FIG. 6 is still another embodiment of the delay circuit according to the present invention. The feature of FIG. 6 is the presence of a current mirror circuit $B_1$ enclosed by a dotted line.

The embodiment of FIG. 6 is the combination of the embodiment of FIG. 1 and the current mirror circuit $B_1$.

The embodiment of FIG. 6 is advantageous when there are a plurality of delay circuits each of which must compensate temperature variation, power voltage variation, and/or process variation. One example of that plurality of delay circuits is a transversal filter in which a plurality of delay circuits coupled in series to each other are used.

The embodiment of FIG. 6 has the advantage that the compensation circuit which is shown in left side of the line X—X is used common to all the delay circuits $T_1$, $T_2, \ldots$, where $T_i$ is a delay element, including a switching transistor $M_1$, a capacitor C and an inverter $Q_1$.

The digital input signals to each delay elements are designated as $V_{IN}(1)$, $V_{IN}(2)$ et al, and the output signals are designated as $V_{OUT}(1)$, $V_{OUT}(2)$ et al.

In the embodiment of FIG. 6, the first FET $M_1$ which receives a digital input signal $V_{IN}$, and a second FET $M_2$ which receives a bias voltage $V_x$ are composed of N-channel elements.

The current mirror circuit $B_1$ has a third MOSFET $M_3$ and a fourth MOSFET $M_4$. The third FET $M_3$ is a P-channel element, having a gate $G_3$ connected to a drain $D_3$, a source $S_3$ connected to the power supply voltage $V_{DD}$, and said drain $D_3$ being connected to a drain $D_2$ of the second FET $M_2$. The fourth FET $M_4$ is a P-channel element having a gate $G_4$ connected to the gate $G_3$ of the third FET $M_3$ so that a current mirror circuit is composed, and a drain $D_4$ connected to the drain $D_1$ of the first FET $M_1$.

The operational waveforms in FIG. 6 are the same as those in FIG. 2. When an input digital signal $V_{IN}(1)$ applied to the gate $G_1$ of the first FET $M_1$ is at high level, the first FET $M_1$ is conductive, and the potential at the point (a) is at low level, since the capacitor C discharges through the first FET $M_1$. When the digital input signal $V_{IN}(1)$ changes to low level, the first FET $M_1$ is cutoff. The fourth FET $M_4$, which is biased by the third FET $M_3$, is in active state. As the fourth FET $M_4$ composes a current mirror circuit with the third FET $M_3$, the current flows in the fourth FET $M_4$ proportional to the current in the series circuit of the second FET $M_2$, the third FET $M_3$ and the resistor $R_c$. The current in the fourth FET $M_4$ charges the capacitor C, and provides the ramp voltage.

The structure and the operation of the bias means 1 in FIG. 6 are the same as those in FIGS. 4 and 5. The embodiment of FIG. 6 provides the delay time free from temperature variation, power supply voltage variation and process variation.

Figure 7:
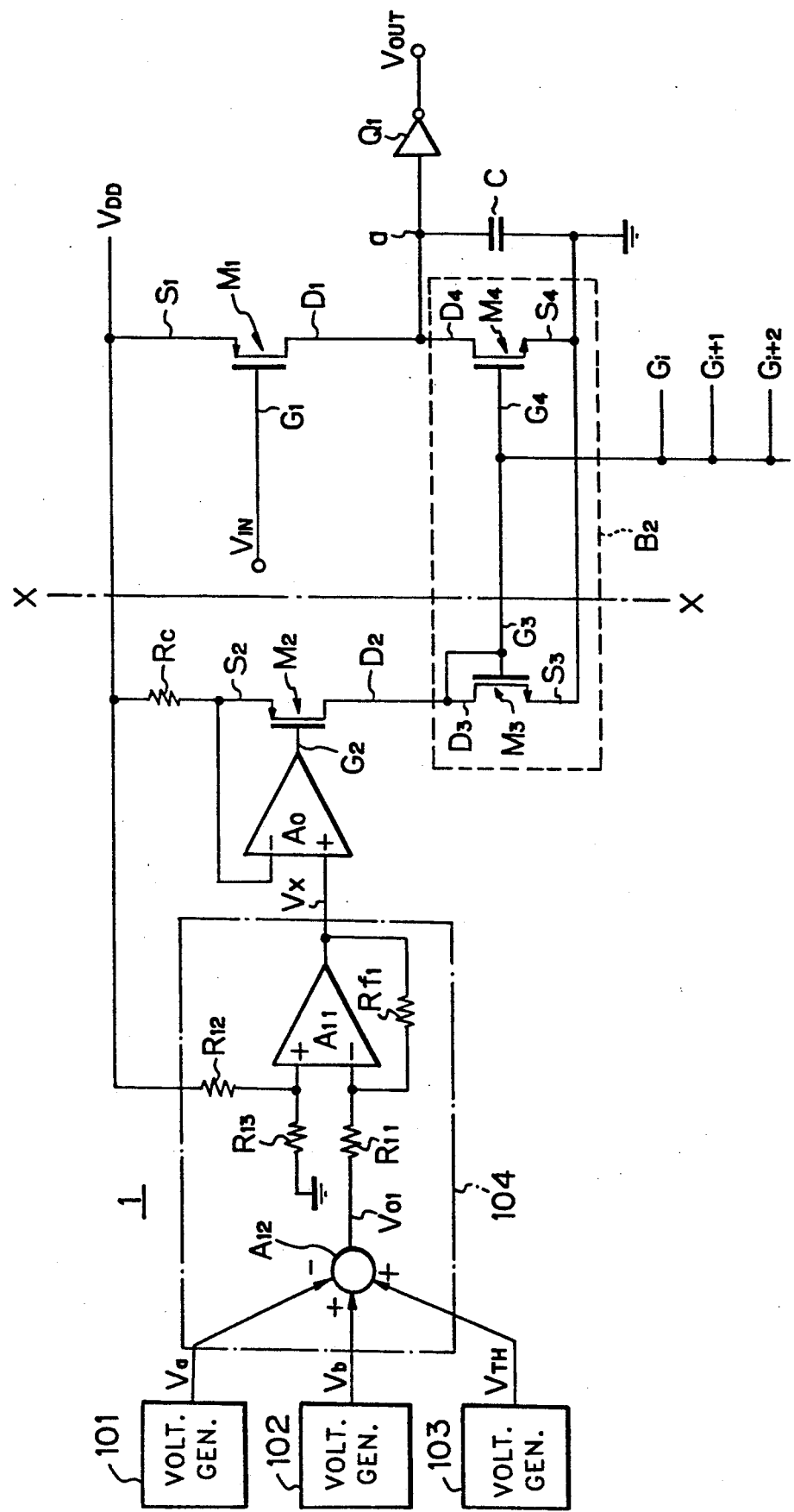
FIG. 7 is a circuit diagram of still another embodiment of the delay circuit according to the present invention.

FIG. 7 shows a circuit diagram of still another embodiment of the delay circuit according to the present invention, which is the combination of a current mirror circuit $B_2$ and the embodiment of FIG. 4.

In FIG. 7, the first FET $M_1$ and the second FET $M_2$ are composed of P-channel elements. The third FET $M_3$ and the fourth FET $M_4$ which compose the current mirror circuit $B_2$ are composed of N-channel elements.

The operational waveforms in FIG. 7 are the same as those in FIG. 13. When the digital input signal $V_{IN}$ applied to the gate $G_1$ of the first FET $M_1$ is in low level, the first FET $M_1$ is conductive, and the capacitor C is charged. Thus, the potential at the point (a) at one end of the capacitor C is at a high level. When the digital input signal $V_{IN}$ changes to a high level and the first FET $M_1$ is non-conductive, the capacitor C discharges through the fourth FET $M_4$ and the ramp voltage is obtained across the capacitor C. The discharge current in the fourth FET $M_4$ is proportional to the current in the path of the second FET $M_2$, the third FET $M_3$ and the resistor $R_c$, because of the current mirror connection of the third FET $M_3$ and the fourth FET $M_4$.

The structure and the operation of the bias circuit 1 in FIG. 7 are the same as that in FIGS. 1 and 3.

It should be appreciated in FIGS. 6 and 7 that a single bias circuit 1 can compensate for the fluctuation of delay time of a plurality of delay circuits $T_i$. In that case, the first FET $M_1$, the fourth FET $M_4$, the capacitor C and the inverter $Q_1$ compose a delay element, in which a gate $G_1$ of a first FET $M_1$ receives a digital input signal $V_{IN}$, and a gate $G_4$ of a fourth FET $M_4$ receives a bias voltage from $G_3$ of a third FET $M_3$ which constitutes a current mirror circuit with a fourth FET $M_4$.

When a plurality of delay circuits are mounted on a semiconductor chip, only a delay element comprising a first FET $M_1$, a fourth FET $M_4$, a capacitor C and a logic circuit $Q_1$ must be mounted in plural, but, a single bias means in left portion from the line X—X in FIGS. 6 and 7 can be common to all the delay elements. Therefore, the area of a semiconductor chip can be reduced as compared with that in which no current mirror circuit is used. And, the power consumption is also reduced by the use of a current mirror circuit.

Figure 8:
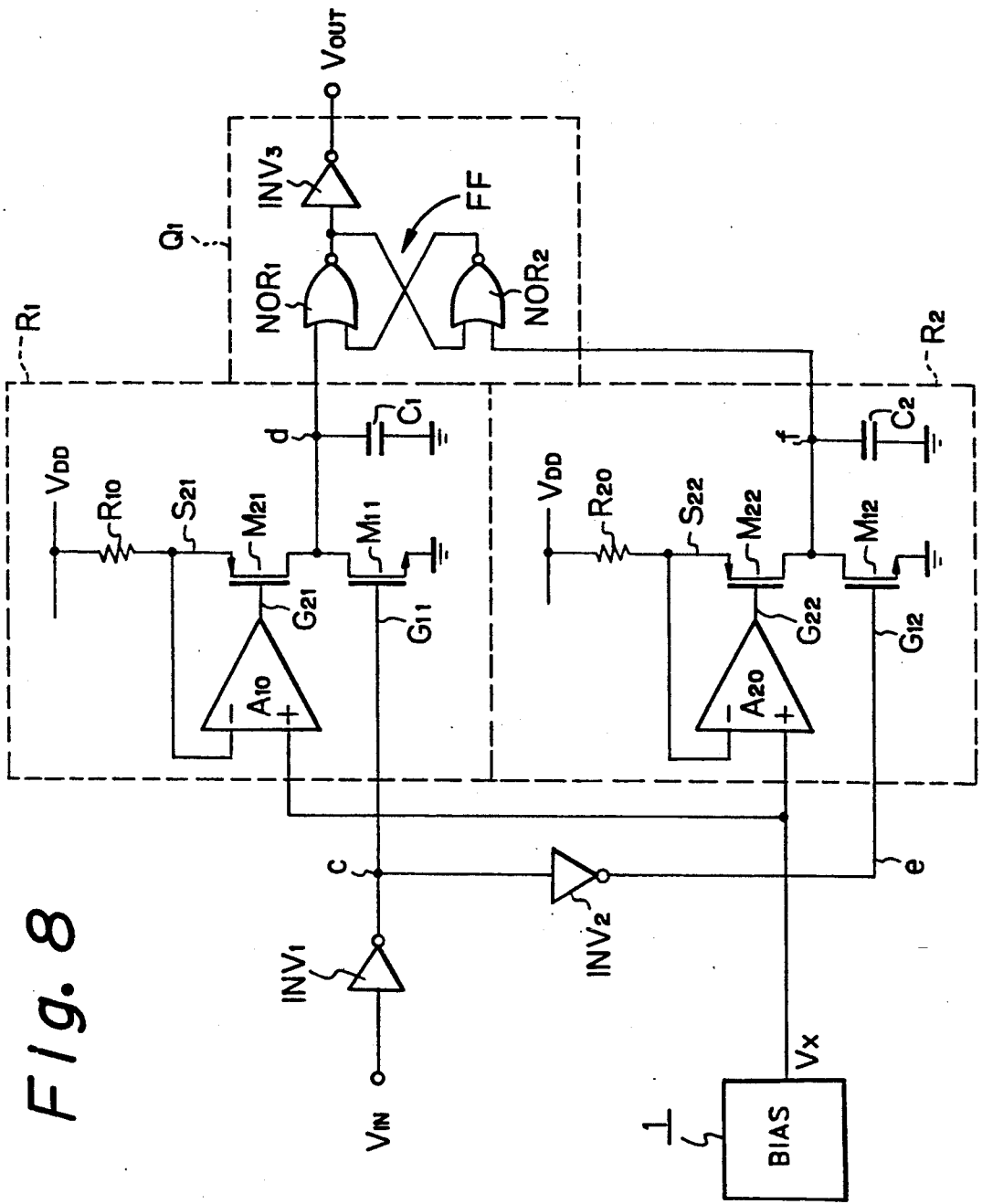
FIG. 8 is a circuit diagram of still another embodiment of the delay circuit according to the present invention.
Figure 9:
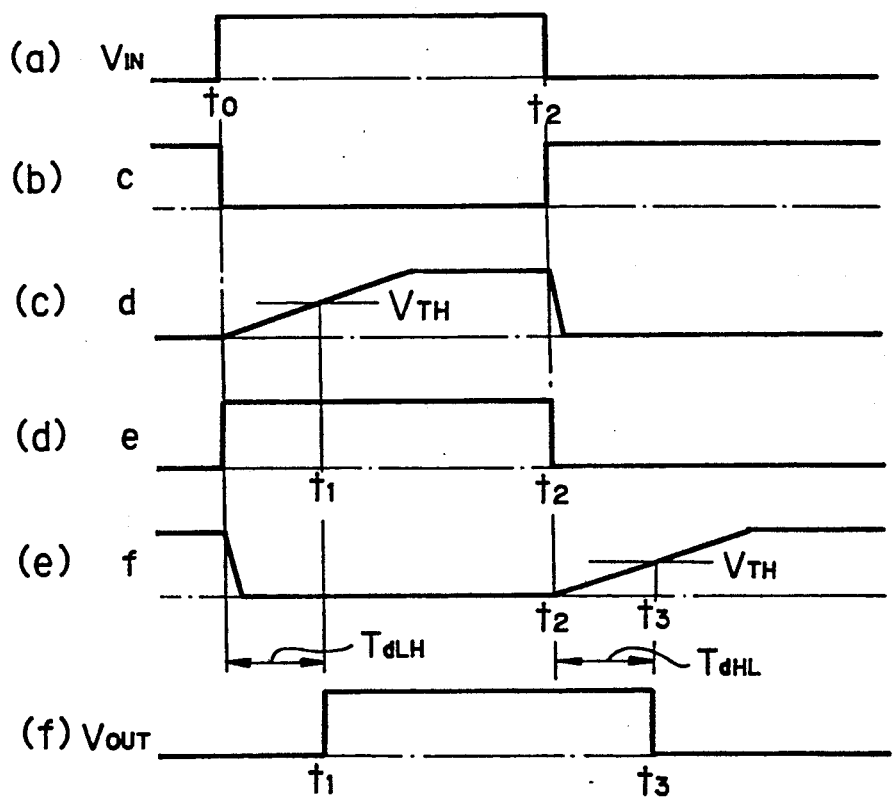
FIG. 9 shows operational waveforms of the circuit of FIG. 8.

FIG. 8 shows a circuit diagram of still another embodiment of the delay circuit according to the present invention, and FIG. 9 shows the operational waveforms of the circuit of FIG. 8. In FIG. 8, a digital input signal $V_{IN}$ is separated to two input signals by using a pair of inverters $INV_1$ and $INV_2$ so that the polarity of two signals is opposite of each other. The first delay circuit or ramp generator $R_1$ operates to delay the beginning edge of an input pulse, and the second delay circuit $R_2$ operates to delay the rear edge of an input pulse. The logic circuit $Q_1$ which includes a flip-flop FF combines the outputs of the first delay circuit $R_1$ and the second delay circuit $R_2$. The output $V_{OUT}$ of the logic circuit $Q_1$ has the pulse width equal to that of a digital input pulse $V_{IN}$, alternatively, the pulse width of the output pulse $V_{OUT}$ may be designed arbitrarily.

The structure of each delay circuits $R_1$ and $R_2$ is essentially the same as that in FIG. 1.

The first delay circuit $R_1$ comprises a first MOSFET $M_{11}$, a second MOSFET $M_{21}$, a resistor $R_{10}$, an operational amplifier $A_{10}$, and a capacitor $C_1$. The gate $G_{21}$ of the first FET $M_{11}$ accepts the digital input signal $V_{IN}$ in the polarity inverted form by the inverter $INV_1$.

The second delay circuit $R_2$ comprises a first MOSFET $M_{12}$, a second MOSFET $M_{22}$, a resistor $R_{20}$, an operational amplifier $A_{20}$, and a capacitor $C_2$. The gate $G_{12}$ of the first FET $M_{12}$ accepts the digital input signal $V_{IN}$ through a pair of series connected inverters $INV_1$ and $INV_2$. The polarity of the input of the first FET $M_{12}$ is the same as that of the original signal $V_{IN}$, because of two inverters.

The logic circuit $Q_1$ comprises a flip-flop FF and an inverter $INV_3$. The flip-flop FF has two NOR (not-OR) gates $NOR_1$ and $NOR_2$, which constitute a RS (set-reset) type flip-flop, which is set by the high level output signal of the first delay circuit $R_1$, and is reset by the high level output signal of the second delay circuit $R_2$.

The negative inputs (−) of each operational amplifiers $A_{10}$ and $A_{20}$ are connected to the sources $S_{21}$, and $S_{22}$, respectively, which are connected to the power source voltage $V_{DD}$ through the resistors $R_{10}$ and $R_{20}$, respectively. The outputs of the operational amplifiers are applied to the gates $G_{21}$ and $G_{22}$ of the second FET's $M_{21}$, and $M_{22}$, respectively. The positive inputs (+) of the operational amplifiers $A_{10}$ and $A_{20}$ are commonly coupled with the output $V_x$ of the bias means 1. The structure of the bias means 1 is substantially the same as that of FIG. 3, except that the inverter $Q_{51}$ in FIG. 3 is replaced to a NOR gate which has the same threshold voltage as that of $NOR_1$ and $NOR_2$.

When a digital input signal $V_{IN}$ changes to high level at time $t_0$ as shown in FIG. 9(a), the potential at point (c) at the output of the inverter $INV_1$ changes to low level as shown in FIG. 9(b). The potential at the point (c) is applied to the gate $G_{11}$ of the first FET $M_{11}$ of the first delay circuit, and then, the ramp voltage begins to increase at time $t_0$ as shown in FIG. 9(c) as described in accordance with FIGS. 1 and 2. When that ramp voltage which is the potential at the point (d) at one end of the capacitor $C_1$ reaches the threshold voltage $V_{TH}$ of the flip-flop FF at time $t_1$, the flip-flop FF is set to 1, and the high level output signal $V_{OUT}$ is obtained as shown in FIG. 9(f). The delay time at the starting edge is $T_{dLH} = T_1 - t_0$.

On the other hand, when the digital input signal $V_{IN}$ changes to low level at time $t_2$, the potential at the point (e) which is the output of the inverter $INV_2$ changes also to low level, where the difference $t_2 - t_0$ is equal to the pulse width of the digital input pulse. The potential at the point (e) is applied to the gate $G_{12}$ of the FET $M_{12}$ of the second delay circuit $D_2$, then, the potential at the point (f) at one end of the capacitor $C_2$ provides the ramp voltage which begins to increase at time $t_2$ as shown in FIG. 9(e). The ramp voltage reaches the threshold voltage $V_{TH}$ of the flip-flop FF at time $t_3$, and then, that flip-flop changes to reset state. Thus, the output of the inverter $INV_3$ changes to low level as shown in FIG. 9(f). The duration between $t_3$ and $t_2$ is the delay time of the rear edge of the digital input pulse.

The first delay time $T_{dLH}$ and the second delay time $T_{dHL}$ are adjusted by the resistance of the resistors $R_{10}$ and $R_{20}$, and the capacitance of the capacitors $C_1$ and $C_2$. When $T_{dLH}$ is equal to $T_{dHL}$, the pulse width of the delayed output pulse $V_{OUT}$ is the same as the pulse width of the input pulse $V_{IN}$. When $T_{dLH}$ differs from $T_{dHL}$, then, the pulse width of the output pulse $V_{OUT}$ may be designed arbitrarily.

It should be appreciated that the embodiment of FIGS. 8 and 9 can provide a delay time which is free from temperature variation, power supply voltage variation, and/or process variation. And, further, the pulse width of the delayed output pulse may be designed arbitrarily.

It should be appreciated of course that a current mirror circuit mentioned in FIG. 6 may be combined to the embodiment of FIGS. 8 and 9. The bias circuit 1 in FIG. 6 may be common to the first delay circuit $D_1$ and the second delay circuit $D_2$.

Figure 10:
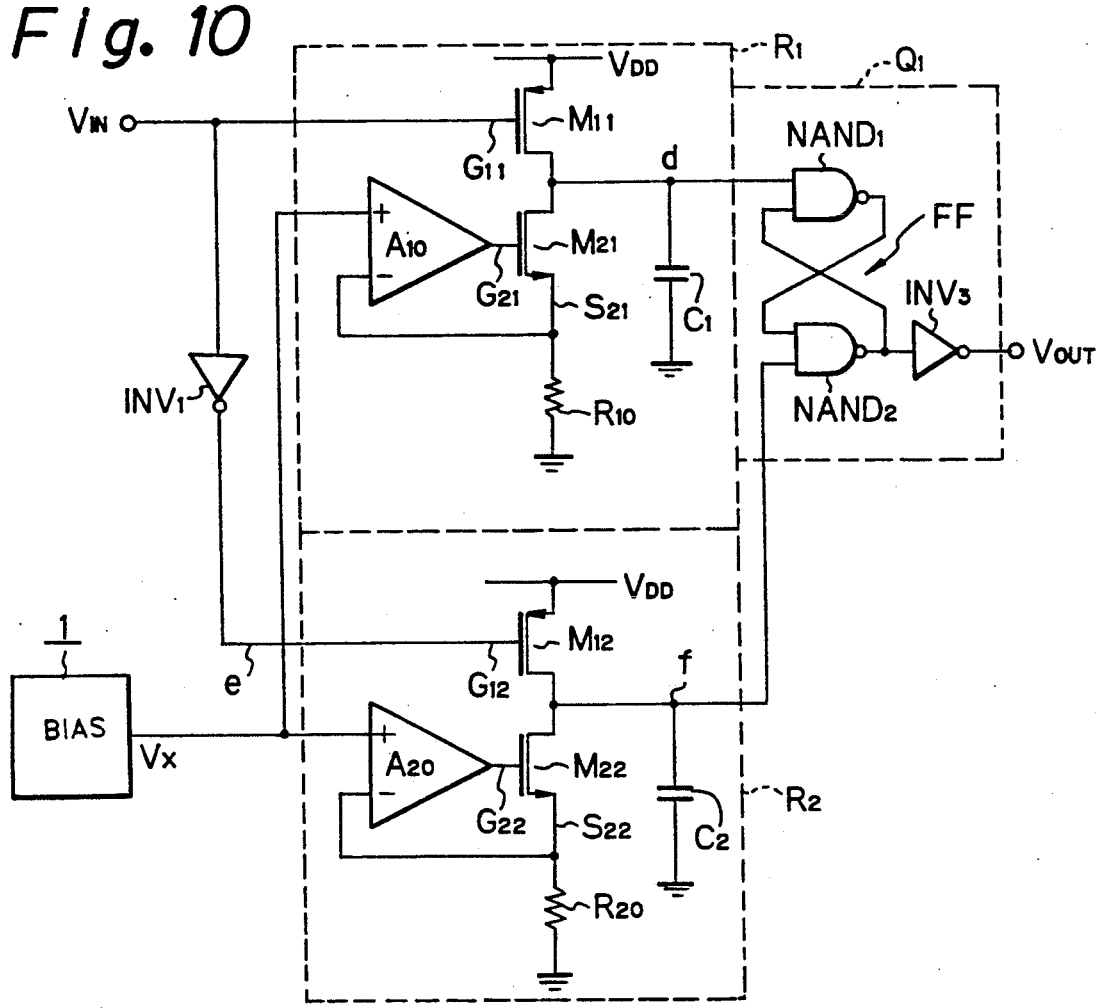
FIG. 10 is a circuit diagram of still another embodiment of the delay circuit according to the present invention.
Figure 11:
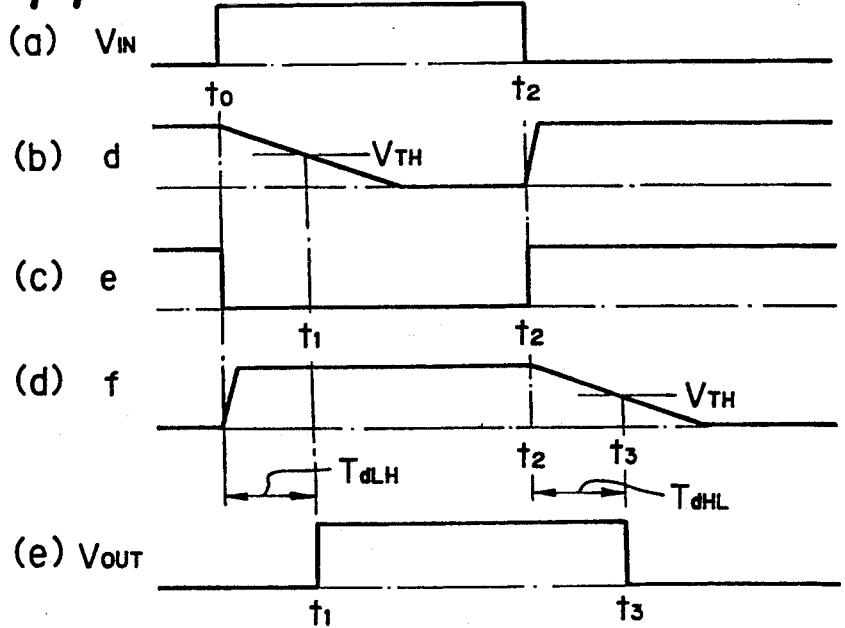
FIG. 11 shows the operational waveforms of the circuit of FIG. 11.

FIG. 10 shows a circuit diagram of still another embodiment of the delay circuit according to the present invention, and FIG. 11 shows the operational waveforms of FIG. 10. Similar to the embodiment of FIG. 8, the digital input signal $V_{IN}$ in FIG. 10 is separated to two paths by using an inverter $INV_1$. The first delay circuit $R_1$ functions to delay the beginning edge of an input pulse, and the second delay circuit $R_2$ functions to delay the rear edge of an input pulse. The logic circuit $Q_1$ combines the outputs of the first delay circuit $R_1$ and the second delay circuit $R_2$, so that the pulse width of the delay output pulse $V_{OUT}$ may be the same as that of the input pulse $V_{IN}$, or may be designed arbitrarily. The structure of the first delay circuit $R_1$ and the second delay circuit $R_2$ is essentially the same as that of FIG. 4. The flip-flop FF in the logic circuit $Q_1$ is composed of NAND gates.

The first delay circuit $R_1$ has an operational amplifier $A_{10}$, the resistor $R_{10}$, the first MOSFET $M_{11}$, the second MOSFET $M_{21}$, and the capacitor $C_1$. The gate $G_{11}$ of the first FET $M_{11}$ receives the digital input signal $V_{IN}$. The second delay circuit $C_2$ has an operational amplifier $A_{20}$, a resistor $R_{20}$, a first MOSFET $M_{12}$, a second MOSFET $M_{22}$, and a capacitor $C_2$. The gate $G_{12}$ of the first FET $M_{12}$ receives the digital input signal $V_{IN}$ in the reversed polarity inverted by the inverter $INV_1$.

The logic circuit $Q_1$ has a flip-flop FF which is a RS (set-reset) flip-flop having a pair of NAND gates $NAND_1$ and $NAND_2$, and is set to one state by low level output signal of the first delay circuit $R_1$, and is reset to zero state by the low level output signal of the second delay circuit $R_2$. The output of the $NAND_2$ is coupled with the output terminal $V_{OUT}$ through the inverter $INV_3$.

The negative inputs (−) of the operational amplifiers $A_{10}$ and $A_{20}$ are connected to the source $S_{21}$ and the source $S_{22}$ of the second FET $M_{21}$ and $M_{22}$, respectively, and are grounded through the resistors $R_{10}$, and $F_{20}$, respectively. The outputs of those amplifiers are connected to the gates $G_{21}$ and $G_{22}$ of the second FET $M_{21}$ and $M_{22}$, respectively.

The positivie inputs (+) of the operational amplifiers $A_{10}$ and $A_{20}$ are commonly connected to the output of the bias means 1.

When a digital input signal $V_{IN}$ becomes high level at time $t_0$ as shown in FIG. 11($a$), the potential at the point (d) in the first delay circuit $R_1$ begins to decrease as shown in FIG. 11($b$) as mentioned in accordance with the embodiment of FIG. 4, since said input signal $V_{IN}$ is applied to the gate $G_{11}$ of the first FET $M_{11}$ of the first delay circuit $D_1$. When the ramp voltage at the point (d) reaches the threshold voltage of the flip-flop FF at time $t_1$, the flip-flop FF is set to one state at time $t_1$, and the high level output signal $V_{OUT}$ is obtained at the output terminal through the inverter $INV_3$. The delay time is $T_{dLH}$ between $t_0$ and $t_1$.

On the other hand, when the digital input signal $V_{IN}$ returns to low level at time $t_2$ which is after the pulse width of the input digital signal from time $t_0$, the potential at the point (e) at the output of the inverter $INV_1$ becomes high level as shown in FIG. 11($c$). The signal at the point (e) is applied to the gate $G_{12}$ of the first FET $M_{12}$ in the second delay circuit $R_2$, and therefore, the potential at the point (f) begins to decrease as shown in FIG. 11($d$). When that potential reaches the threshold voltage of the flip-flop FF at time $t_3$, the flip-flop FF is set to one state at time $t_3$, and the low level output signal $V_{OUT}$ is obtained through the inverter $INV_3$ as shown in FIG. 11($e$). The delay time $T_{dHL}$ is the time between $t_3$ and $t_2$.

If the delay time $T_{dLH}$ is equal to the delay time $T_{dHL}$ by appropriate selection of the resistance of the resistors $R_{10}$ and $R_{20}$, and the capacitance of the capacitors $C_1$ and $C_2$, the pulse width of the input signal $V_{IN}$ is equal to the pulse width of the output pulse $V_{OUT}$. Of course, the pulse width of an output pulse may be designed arbitrarily by designing the delay times $T_{dLH}$ and $T_{dHL}$ independently.

It should be appreciated of course that the combination of the circuit of FIG. 10 and a current mirror circuit as mentioned in accordance with FIG. 7 is possible. At that case, the bias circuit having an operational amplifier $A_0$, a resistor $R_c$, and a pair of operational amplifiers $M_2$ and $M_3$ in FIG. 7 may be common to both the first delay circuit $R_1$ and the second delay circuit $R_2$.

A delay line having a plurality of taps may be constituted by a plurality of delay circuits of FIG. 8 or FIG. 10. That delay line is used in a transversal filter. In that case, the inverter $INV_1$ is omitted by taking a first input to the gate $G_{11}$ at the input of the inverter $INV_3$, and a second input to the gate $G_{12}$ at the output of the inverter $INV_3$. The omission of an input inverter $INV_1$ is advantageous to reduce the load of the output inverter $INV_3$ which would provide an additional delay time in case of heavy load.

From the foregoing it will now be apparent that a new and improved delay circuit has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A delay circuit comprising at least one ramp generator for providing a ramp voltage initiated by at a digital input signal, a logic circuit accepting said ramp voltage and providing a digital output signal which is delayed by a predetermined duration from said digital input signal when said ramp voltage reaches a predetermined threshold voltage, and a bias means for providing bias voltage to said ramp generator, said ramp generator comprising;
   a switching means comprising a first MOSFET which is switched ON and OFF by said digital input signal,
   a charge/discharge means comprising a second MOSFET, a resistor which is connected in series to a drain-source circuit of said second MOSFET, and an operational amplifier with an output coupled with a gate of said second MOSFET, a negative input coupled with the junction of said resistor and said second MOSFET, and a positive input which accepts a bias voltage,
   a capacitor which is charged and/or discharged through said charge/discharge means, and provides said ramp voltage across the capacitor, and
   a current mirror circuit coupled with said charge/discharge means; said capacitor being charged and/or discharged through said current mirror circuit which provides the same current as that in the charge/discharge means;
said bias means comprising at least one of means for providing voltage proportional to temperature variation and means for providing voltage proportional to said threshold voltage of said logic circuit.

2. A delay circuit according to claim 1, wherein two ramp generators are provided so that a digital input signal is applied to each of the ramp generators in opposite polarities to each other, and wherein said logic circuit has an flip-flop which is set and reset by outputs of the respective ramp generators.

3. A delay circuit according to claim 1, wherein said bias means comprises;
   a first compensation voltage generator for providing voltage which changes linearly according to temperature change,
   a second compensation voltage generator for providing voltage which is free from temperature change,
   a third compensation voltage generator for providing voltage which is proportional to said threshold voltage of said logic circuit,
   a combiner for combining outputs of the above three compensation means, and
   means for suppressing variation of power supply voltage from the output of said combiner.

4. A delay circuit according to claim 3, wherein said current mirror circuit has a third MOSFET and a fourth MOSFET with respective gates connected together, respective sources connected together, a gate of the third MOSFET being connected to a drain of the third MOSFET, and the third MOSFET being coupled with said charge/discharge means, and the fourth MOSFET being coupled with said capacitor.

5. A delay circuit according to claim 1, wherein said logic circuit is an inverter.

6. A delay circuit according to claim 1, wherein one end of said capacitor is grounded, and the other end of said capacitor is coupled with power supply voltage through said charge/discharge means.

7. A delay circuit according to claim 1, wherein one end of said capacitor is grounded, and the other end of said capacitor is coupled with power supply voltage through said switching means.

8. A delay circuit according to claim 1, wherein said means for providing voltage proportional to temperature change has a pair of bipolar transistors in diode connection and an operational amplifier receiving respective outputs of said bipolar transistors.

9. A delay circuit comprising at least one ramp generator for providing a ramp voltage initiated by a digital input signal, a logic circuit accepting said ramp voltage and providing a digital output signal which is delayed by a predetermined duration from said digital input signal when said ramp voltage reaches a predetermined threshold voltage, and a bias means for providing bias voltage to said ramp generator, said ramp generator comprising;
 a switching means comprising a first MOSFET which is switched ON and OFF by said digital input signal,
 a charge/discharge means comprising a second MOSFET, a resistor which is connected in series to a drain-source circuit of said second MOSFET, and an operational amplifier with an output coupled with a gate of said second MOSFET, a negative input coupled with the junction of said resistor and said second MOSFET, and a positive input which accepts a bias voltage, and
 a capacitor which is charged and/or discharged through said charge/discharge means, and provides said ramp voltage across the capacitor,
said bias means comprising at least one of means for providing voltage proportional to temperature variation and means for providing voltage proportional to said threshold voltage of said logic circuit, said means for providing voltage proportional to temperature change including a pair of bipolar transistors in diode connection and an operational amplifier receiving respective outputs of said bipolar transistors.

10. A delay circuit according to claim 9, wherein a current mirror circuit is coupled with said charge/discharge means, and said capacitor is charged and/or discharged through said current mirror circuit which provides the same current as that in the charge/discharge means.

11. A delay circuit according to claim 9, wherein two ramp generators are provided so that a digital input signal is applied to each of the ramp generators in opposite polarities to each other, and wherein said logic circuit has a flip-flop which is set and reset by outputs of the respective ramp generators.

12. A delay circuit according to claim 9, wherein said bias means comprises;
 a first compensation voltage generator for providing voltage which changes linearly according to temperature change,
 a second compensation voltage generator for providing voltage which is free from temperature change,
 a third compensation voltage generator for providing voltage which is proportional to said threshold voltage of said logic circuit,
 a combiner for combining outputs of the above three compensation means, and
 means for suppressing variation of power supply voltage from the output of said combiner.

13. A delay circuit according to claim 9, wherein said logic circuit is an inverter.

14. A delay circuit according to claim 9, wherein one end of said capacitor is grounded, and the other end of said capacitor is coupled with power supply voltage through said charge/discharge means.

15. A delay circuit according to claim 9, wherein one end of said capacitor is grounded, and the other end of said capacitor is coupled with power supply voltage through said switching means.

16. A delay circuit according to claim 12, wherein said current mirror circuit has a third MOSFET and a fourth MOSFET with respective gates connected together, respective sources connected together, a gate of the third MOSFET being connected to a drain of the third MOSFET, and the third MOSFET being coupled with said charge/discharge means, and the fourth MOSFET being coupled with said capacitor.

* * * * *